(12) United States Patent
Do

(10) Patent No.: US 7,764,106 B2
(45) Date of Patent: Jul. 27, 2010

(54) SEMICONDUCTOR DEVICE

(75) Inventor: Chang-Ho Do, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 76 days.

(21) Appl. No.: 11/647,350

(22) Filed: Dec. 29, 2006

(65) Prior Publication Data

US 2008/0042724 A1 Feb. 21, 2008

(30) Foreign Application Priority Data

Jul. 20, 2006 (KR) ...................... 10-2006-0068123

(51) Int. Cl.
*H03L 5/00* (2006.01)
(52) U.S. Cl. ........................ 327/333; 327/63; 327/68; 327/80; 327/81
(58) Field of Classification Search ................. 327/333, 327/63, 68, 80, 81
See application file for complete search history.

(56) References Cited

U.S. PATENT DOCUMENTS

| | | | |
|---|---|---|---|
| 6,157,203 A * | 12/2000 | Takahashi ................ | 326/21 |
| 6,212,091 B1 | 4/2001 | Kawabata et al. | |
| 6,278,300 B1 * | 8/2001 | Urakawa .................. | 327/112 |
| 6,437,824 B1 * | 8/2002 | Suzuki et al. ............ | 348/222.1 |
| 6,828,852 B2 * | 12/2004 | Klass et al. .............. | 327/564 |
| 6,831,483 B2 * | 12/2004 | Shimazaki et al. ........ | 326/121 |
| 6,999,375 B2 | 2/2006 | Jung et al. | |
| 7,005,907 B2 * | 2/2006 | Ibuka ..................... | 327/295 |
| 7,248,075 B2 * | 7/2007 | Min et al. ................ | 326/80 |
| 7,317,335 B2 * | 1/2008 | Min et al. ................ | 326/81 |
| 7,365,573 B2 * | 4/2008 | Okada .................... | 326/86 |
| 2005/0047047 A1 | 3/2005 | Matsuno | |
| 2006/0028245 A1 * | 2/2006 | Min et al. ................ | 326/81 |
| 2006/0114048 A1 * | 6/2006 | Shiratake et al. ......... | 327/333 |

(Continued)

FOREIGN PATENT DOCUMENTS

JP 07-201852 8/1995

(Continued)

OTHER PUBLICATIONS

Korean Office Action issued in Korean Patent Application No. KR 10-2006-0068123, dated on Feb. 29, 2008.

(Continued)

*Primary Examiner*—Lincoln Donovan
*Assistant Examiner*—Adam D Houston
(74) *Attorney, Agent, or Firm*—IP & T Law Firm PLC

(57) ABSTRACT

A semiconductor device is capable of stably maintaining a voltage level of a shield line, even when a voltage level of an adjacent line is varied. The semiconductor device includes normal lines arranged for transfer of signals, a shield line arranged adjacently to the normal lines, a level shifting circuit for receiving an input signal swinging between a power supply voltage level and a ground voltage level, and shifting the input signal to an output signal swing between the power supply voltage level and a low voltage level lower than the ground voltage level by a predetermined level to output a shifted signal via the shield line, and a signal input unit for transferring the signal provided via the shield line to an output node.

14 Claims, 7 Drawing Sheets

U.S. PATENT DOCUMENTS

| | | | |
|---|---|---|---|
| 2007/0002188 A1* | 1/2007 | Kumagai et al. | 348/751 |
| 2007/0146941 A1* | 6/2007 | Harris et al. | 361/18 |
| 2007/0206781 A1* | 9/2007 | Sasaki et al. | 379/417 |
| 2007/0236272 A1* | 10/2007 | Min et al. | 327/333 |
| 2008/0116943 A1* | 5/2008 | Nair | 327/108 |

FOREIGN PATENT DOCUMENTS

| | | |
|---|---|---|
| JP | 10-135824 | 5/1998 |
| JP | 2001-014854 | 1/2001 |
| JP | 2004-186561 | 7/2004 |
| JP | 2005-072514 | 3/2005 |
| JP | 2005-347413 | 12/2005 |
| JP | 2006-108406 | 4/2006 |
| KR | 10-2005-0063203 A | 6/2005 |
| TW | 1255037 | 5/2006 |

OTHER PUBLICATIONS

Notice of Preliminary Rejection issued from Taiwanese Intellectual Property Office on Mar. 12, 2010 with English Translation.

* cited by examiner $$\Delta Vc = \frac{Cc1 + Cc2}{Csb + Cc1 + Cc2} VDD$$

SEMICONDUCTOR DEVICE

CROSS-REFERENCE TO RELATED APPLICATION

The present invention claims priority of Korean patent application number 10-2006-0068123, filed on Jul. 20, 2006, which is incorporated by reference in its entirety.

BACKGROUND OF THE INVENTION

The present invention relates to a semiconductor device; and, more particularly, to a semiconductor device having a shield line.

As well-known in the art, a semiconductor device is a semiconductor device for storing quantities of data. This semiconductor device can be largely divided into a data storage area storing data and a peripheral area for effectively accessing the data stored in the data storage area. The data storage area has a plurality of unit cells for storing a corresponding number of data bits. The peripheral area has a data output circuit for receiving the data stored in the data storage area and outputting the data externally, a data input circuit for conveying externally received data to the data storage area, and an address input circuit for receiving addresses for designating locations of data to be accessed. In addition, the peripheral area further has a mode register which stores information that enables the above circuits to operate normally. For example, the mode register stores information such as a burst length denoting the number of data bits output during a single data access, a Column Address Strobe (CAS) latency denoting a time from an input of the address to an output of corresponding data, and so on.

In the general semiconductor device, the data input circuit, the data output circuit and the address input circuit are circuits that are continuously operated during a data access operation. On the other hand, circuits such as the mode register are not operated for every data access, but are operated only when the semiconductor device sets related information during an initial operation. Therefore, once each of lines or wires associated with the mode register is designated at one level, is the level need not be varied while a data access operation is performed.

The semiconductor device employs these lines as shield lines of other lines in order to effectively arrange internal circuits and lines. However, one shortcoming is that there may be an error due to a variation of a voltage level of each line which is under the protection of the shields lines. Namely, the shield lines are influenced by level transition of the lines which are under the protection of the shields lines, thus making it possible to transition to an opposite level without maintaining an originally required level.

FIG. 1 is a diagram showing coupling capacitors between lines.

Referring to FIG. 1, there are provided a shield line S, lines A1 and A2 that are under the protection of the shield line, and coupling capacitors Cc1 and Cc2 disposed therebetween. In addition, there is a parasitic capacitor Csb between the shield line S and a substrate. When a voltage level of the lines A1 and A2 rises from a ground voltage level to a power supply voltage level, a voltage of the shield line S arranged therebetween will rise by ΔVc. At this time, the risen level affects the operation of circuits coupled to the shield line, and thus, a level of signal other than a predetermined level may be output via the shield line S. An equation shown in FIG. 1 is derived under the assumption that no charge additionally flows into the lines A1 and A2. Actually, since the semiconductor device has a driver for driving the lines A1 and A2, the variation widths of the lines A1 and A2 may be different from each other depending on the driving capability of the driver driving the lines A1 and A2 and resistance thereof.

FIG. 2 is a diagram for more particularly describing the problem caused by the coupling capacitors shown in FIG. 1.

With reference to FIG. 2, a shield line S is arranged for transferring a signal output from a signal output unit 10 to a signal input unit 20. The signal transferred through the shield line S is not intended to be varied once it is set, such as the signal required when the memory device is initially sets. Therefore, in a normal mode that allows the memory device to perform a data access operation, a level of a signal applied to the shield line S is not varied if it is set once.

It is first assumed that the shield line S is maintained at a logic low level and a signal is continuously delivered to each of the lines A1 and A2 adjacent to the shield line S. When the signal to each of the lines A1 and A2 rises from the ground voltage level to the power supply voltage, the voltage level of the shield line S rises by ΔVb by the coupling effect. At this time, if the voltage level by the risen voltage ΔVb is higher than a threshold voltage of MOS transistors arranged in the signal input unit 20, the MOS transistor MN2 is turned on. When the MOS transistor MN2 is turned on, a voltage level at a node N2 transitions from a logic high level to a logic low level. This implies that a normally set signal is changed to an improper level which may cause an error in the operation of the semiconductor device.

The above problem may also be caused when the voltage level of the shield line S is maintained at a logic high level. In this case, when the voltage level of the lines A1 and A2 drops from a logic high level to a logic low level, the voltage level of the shield line S can drop from the logic high level by ΔVb. Because of the dropped voltage by ΔVb, when the MOS transistor MP2 is turned on, the level at the node N2 can transition from the logic low level to the logic high level. This also implies that a normally set signal is changed to an improper level, which makes the semiconductor device malfunction and cause any error therein. In order to solve the above problem, the shield line can include a dummy line through which no signal is transferred, but in this case, a circuit size is increased.

SUMMARY OF THE INVENTION

It is, therefore, an object of the present invention to provide a semiconductor device which is capable of stably maintaining a voltage level of a shield line, even when a voltage level of an adjacent line is varied.

In accordance with one aspect of the present invention, there is provided a semiconductor device, including: normal lines arranged for transfer of signals; a shield line arranged adjacently to the normal lines; a level shifting circuit for receiving an input signal swinging between a power supply voltage level and a ground voltage level, and shifting the input signal to an output signal swing between the power supply voltage level and a low voltage level lower than the ground voltage level by a predetermined level to output a shifted signal via the shield line; and a signal input unit for transferring the signal provided via the shield line to an output node.

In accordance with another aspect of the present invention, there is provided a semiconductor device, including: normal lines arranged for transfer of signals; a shield line arranged adjacently to the normal lines; a level shifting circuit for receiving an input signal swinging between a power supply voltage level and a ground voltage level, and shifting the input signal to an output signal swing between a high voltage level higher than the power supply voltage level and the ground voltage level to output a shifted signal via the shield line; and a signal input unit for transferring the signal provided via the shield line to an output node.

In accordance with still another aspect of the present invention, there is provided a semiconductor device, including: normal lines arranged for transfer of signals; a shield line arranged adjacently to the normal lines; a level shifting circuit for receiving an input signal swinging between a power supply voltage level and a ground voltage level, and shifting the input signal to an output signal swinging between a high voltage level higher than the power supply voltage level by a predetermined level and a low voltage level lower than the ground voltage level by a predetermined level to output a shifted signal via the shield line; and a signal input unit for transferring the signal provided via the shield line to an output node.

In accordance with still yet another aspect of the present invention, there is provided a method for driving a semiconductor device, including the steps of: generating a control signal to maintain a ground voltage level; driving a voltage level on a shield line to a low voltage lower than the ground voltage by a predetermined level by using the control signal; and transferring the signal under the state that the shield line is being driven.

In accordance with a further another aspect of the present invention, there is provided a method for driving a semiconductor device, including the steps of: generating a control signal to maintain a power supply voltage level; driving a voltage level on a shield line to a high voltage higher than the power supply voltage by a predetermined level by using the control signal; and transferring the signal under the state that the shield line is being driven.

In accordance with an additional aspect of the present invention, there is provided a method for driving a semiconductor device, including the steps of: generating an input signal swinging between a power supply voltage level and a ground voltage level; level-shifting the input signal to a driving signal swinging between a high voltage level higher than the power supply voltage by a predetermined level and a low voltage level lower than the ground voltage level by a predetermined level; driving a shield line by using the driving signal; and transferring the signal under the state that the shield line is being driven.

Other objectives and advantages of the invention will be understood by the following description and will also be appreciated by the embodiments of the invention more clearly.

DESCRIPTION OF SPECIFIC EMBODIMENTS

Hereinafter, preferred embodiments of the present invention will be set forth in detail with reference to the accompanying drawings to the extent so that a person skilled in the art can easily carry out the invention.

Figure 1:
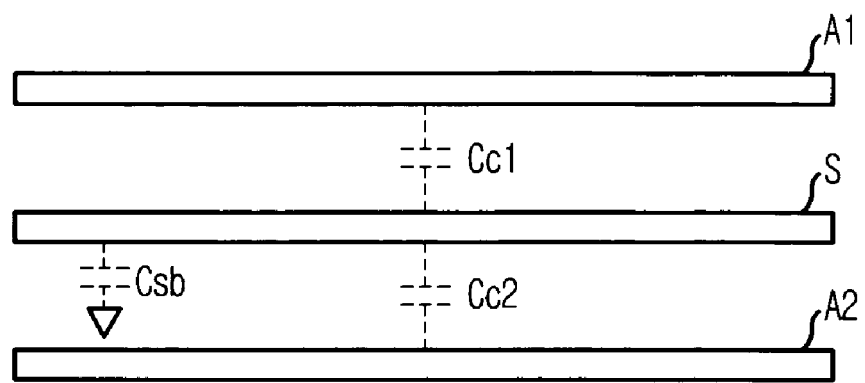
FIG. 1 is a diagram showing coupling capacitors between lines.
Figure 1:
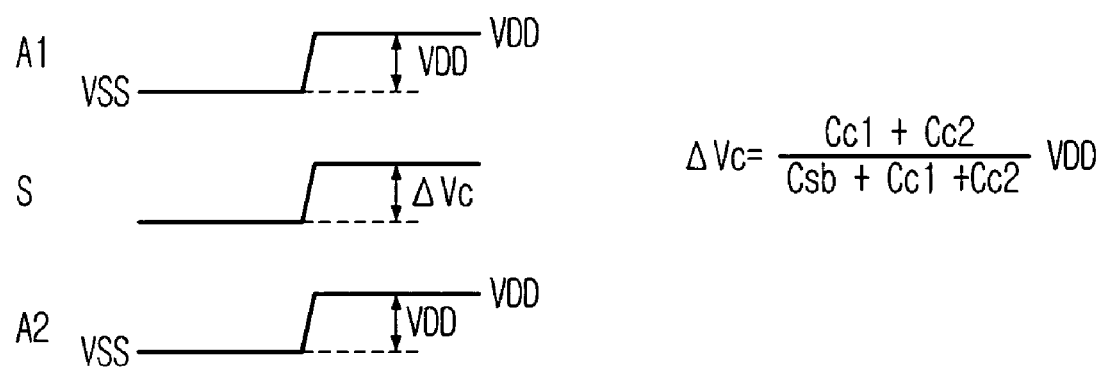
Figure 2:
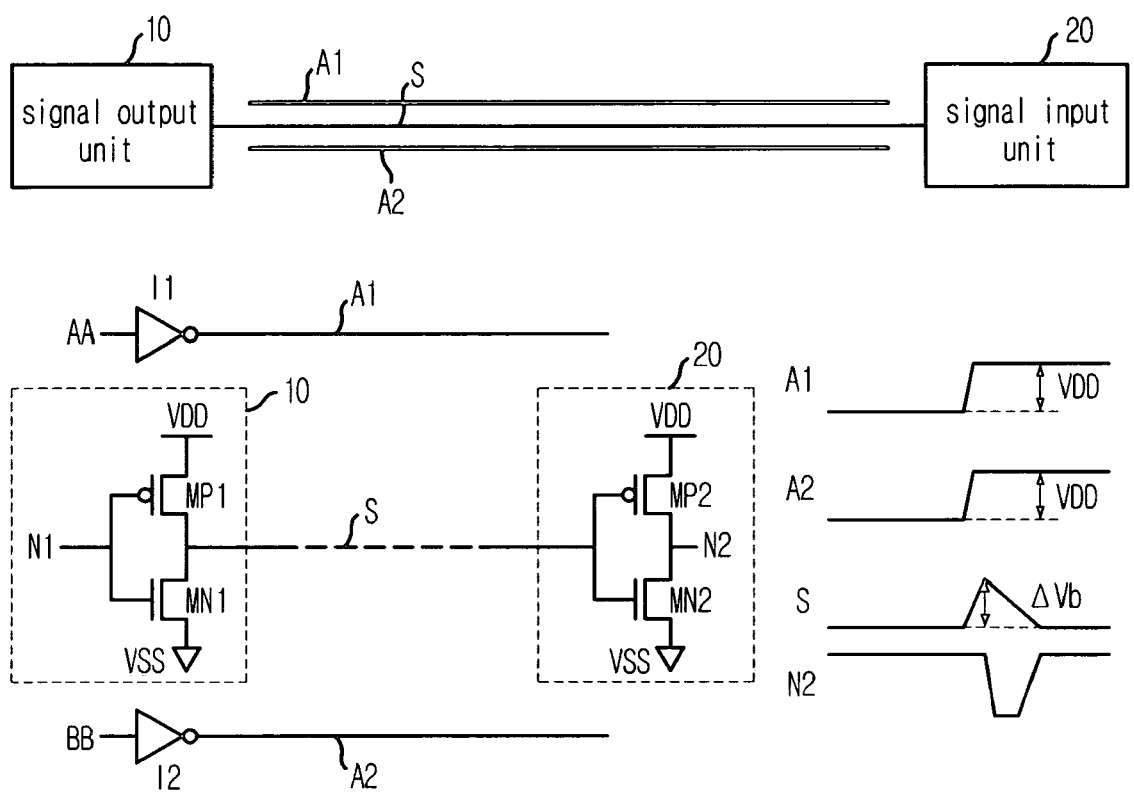
FIG. 2 is a diagram for describing the problem caused by the coupling capacitors shown in FIG. 1.
Figure 3:
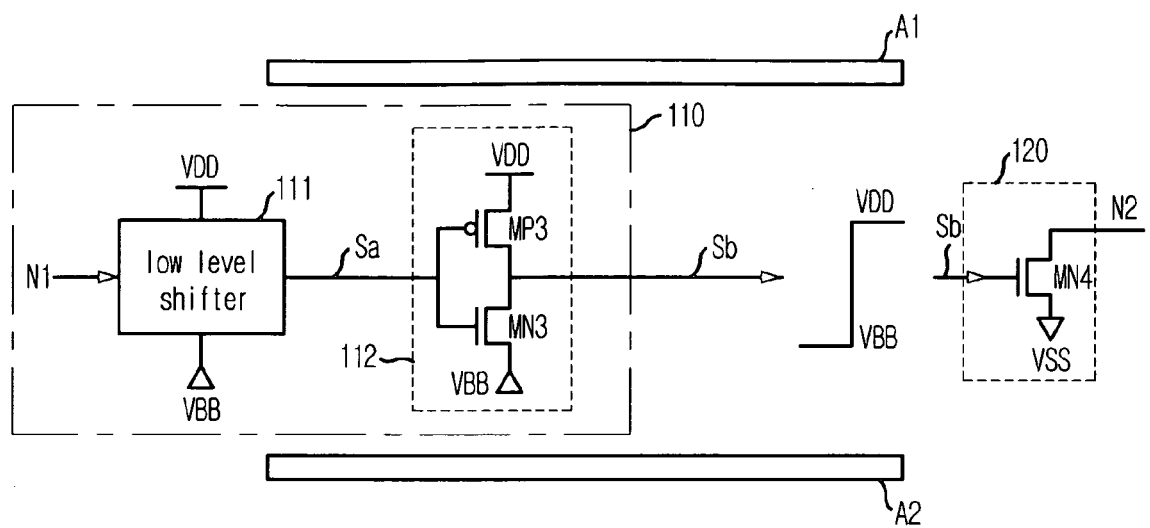
FIG. 3 is a circuit diagram of a semiconductor device in accordance with a first embodiment of the present invention.

FIG. 3 is a circuit diagram of a semiconductor device in accordance with a first embodiment of the present invention.

Referring to FIG. 3, the semiconductor device of this embodiment includes normal lines A1 and A2 arranged for transfer of signal, a shield line Sb arranged adjacently to the normal lines A1 and A2, a level shifting circuit 110 for receiving an input signal N1 swinging between a power supply voltage VDD level and a ground voltage VSS level, shifting the input signal to an output signal swinging between the power supply voltage VDD level and a low voltage level VBB lower than the ground voltage VSS level by a predetermined level and outputting the output signal via the shield line Sb, and a signal input unit 120 for transferring the signal provided via the shield line Sb to an output node. The normal lines A1 and A2 are arranged in regions adjacent to one side and the other side of the shield line Sb respectively.

The level shifting circuit 110 is provided with a low level shifter 111 for level-shifting a level of the input signal to swing between the power supply voltage VDD and the low voltage level VBB, and a driver 112 for driving the shield line Sb by using the signal level-shifted by the low level shifter 111.

The driver 112 is provided with a PMOS transistor MP3 whose one side is connected to the power supply voltage supplying terminal VDD and gate receives an output of the level shifter 111, and an NMOS transistor MN3 whose one side is connected to the other side of the PMOS transistor MP3, gate receives the output of the level shifter 111, and other side is connected to the low voltage supplying terminal VBB.

The signal input unit 120 is provided with a pull-down MOS transistor MN4 for pulling-down the output node N2 by using the signal transferred via the shield line Sb. The low voltage VBB is lower than the ground voltage VSS by a threshold voltage level of the MOS transistor MN4.

A line in which a certain voltage level is set during an initial operation of the semiconductor device and the set voltage level is not varied during a normal operation is mainly used as the shield line Sb. In the case of the semiconductor device, when an active operation and a precharge operation, a write/read operation and a refresh operation are carried out, a line through which a signal is maintained at a constant level without any variation of its phase may be applied as the shield line. For example, in the case of the semiconductor device, the signal delivered through the shield line Sb can be at least one of a signal for controlling a burst length of the semiconductor device, a signal for controlling a CAS latency, a control signal for controlling on/off operations of a delay locked loop, a control signal for controlling On Die Terminal (ODT), a control signal for deciding a driving capability of the output driver 112, a control signal for controlling timing of write recovery, a control signal for controlling a test mode and the like.

The level shifter 111 may be located at the front end of the driver 112 or at any other place. For instance, if a signal to be applied to the shield line is generated by decoding diverse signals, the level shifter may be arranged at the front end of a decoder (not shown) for level-shifting the signal before decoding it. In such a case, the decoder decodes an output signal of the level shifter and then conveys a decoded signal to the shield line.

Further, in the semiconductor device, a voltage maintaining a level lower than the ground voltage and used as a bulk voltage may be employed as the low voltage VBB as it is. In this case, it does not need to have a separate generator for generating the low voltage VBB.

Figure 4:
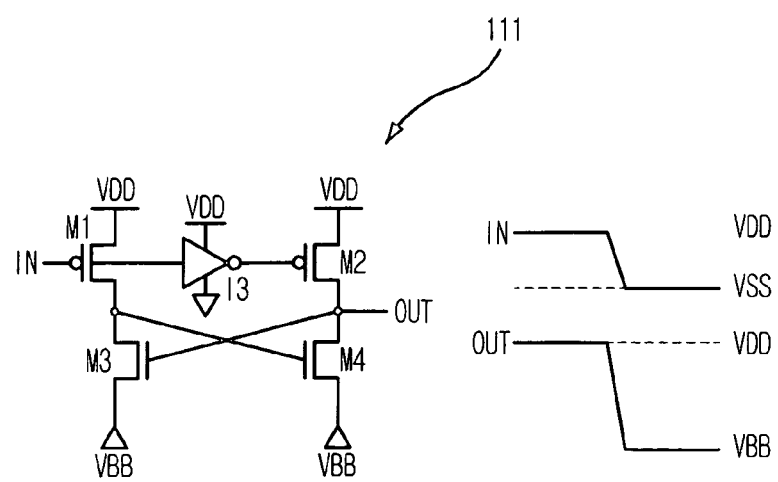
FIG. 4 is a detailed circuit diagram of the low level shifter shown in FIG. 3.

FIG. 4 is a detailed circuit diagram of the low level shifter shown in FIG. 3.

Referring to FIG. 4, the low level shifter 111 is provided with a PMOS transistor M1 whose one side is connected to the power supply voltage supplying terminal VDD and gate receives the input signal IN, an inverter I3 receiving the input signal IN via an input terminal, a PMOS transistor M2 whose one side is connected to the power supply voltage supplying terminal VDD and gate receives an output of the inverter I3, an NMOS transistor M3 whose one side is connected to the other side of the PMOS transistor M1, gate is connected to the other side of the PMOS transistor M2, and other side is connected to the low voltage supplying terminal VBB through which the low voltage is supplied, and an NMOS transistor M4 whose one side is connected to the other side of the PMOS transistor M2, gate is connected to the other side of the PMOS transistor M1, and other side is connected to the low voltage supplying terminal VBB.

Figure 5:
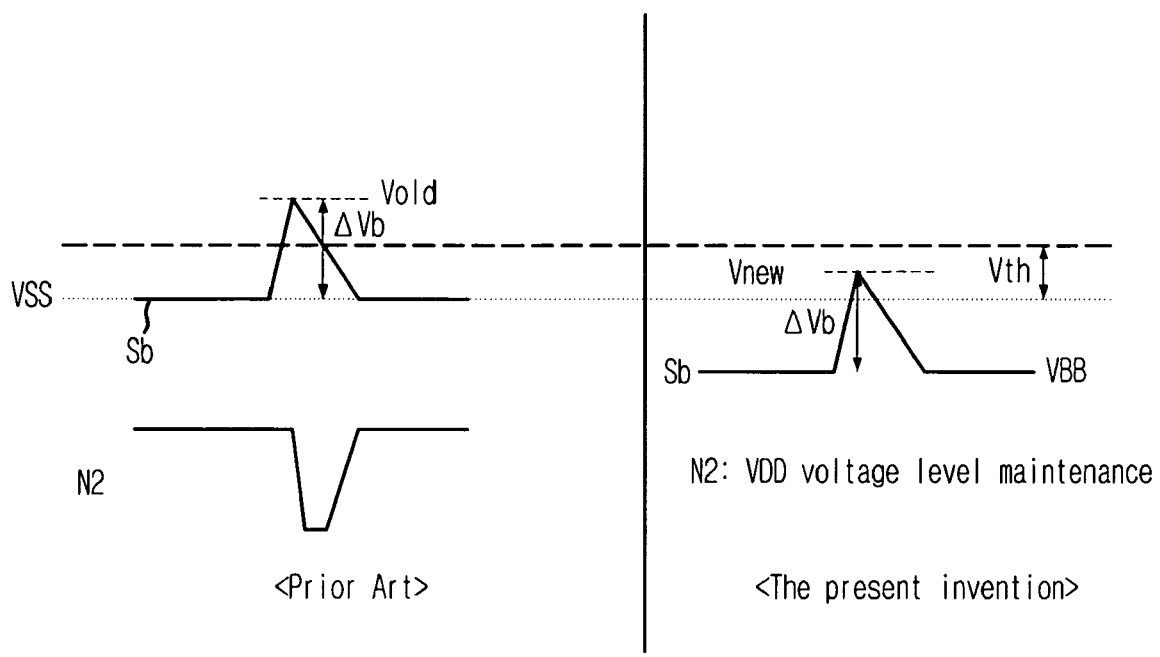
FIG. 5 is a waveform diagram representing the operation of the semiconductor device shown in FIG. 3.

FIG. 5 is a waveform diagram representing the operation of the semiconductor device shown in FIG. 3. The operation of the semiconductor device of this embodiment will be described in detail with reference to FIGS. 3 to 5.

Referring to the left side of the waveform shown in FIG. 5, if a voltage level on the shield line is maintained at the ground voltage level, a voltage at the node N2 is varied in an undesired direction by a variation of a signal passing through its adjacent lines A1 and A2, which may cause an error.

As shown in the right side of the waveform in FIG. 5, the semiconductor device of this embodiment maintains the low voltage level VBB, rather than maintaining the ground voltage level VSS, if the shield line is maintained at the logic low level. Here, the low voltage is maintained at a level lower than the ground voltage level VSS by a threshold voltage of the MOS transistor MN4 constituting the signal input unit 120.

Although the voltage level applied to the shield line Sb has risen by ΔVb due to a transition of a signal passing through the adjacent lines A1 and A2, the MOS transistor MN4 of the signal input unit 120 is not turned on at an undesired time since it has risen from the low voltage VBB level by ΔVb. Therefore, although the voltage level on the shield line Sb is varied by the coupling effect, the signal transferred through the node N2 is maintained in the original state. Namely, the node N2 is allowed to be maintained at the power supply voltage level.

Figure 6:
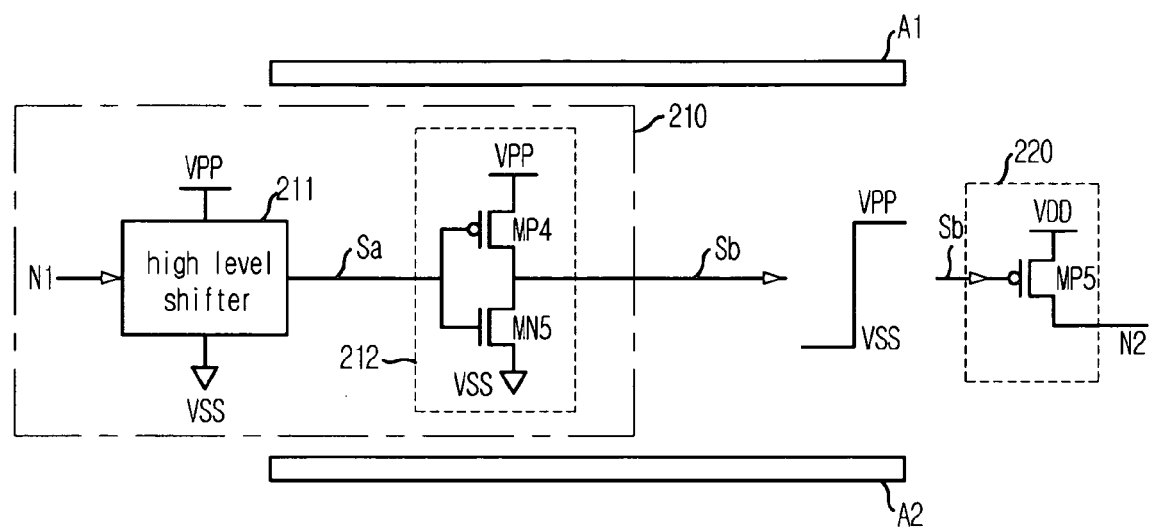
FIG. 6 is a circuit diagram of a semiconductor device in accordance with a second embodiment of the present invention.

FIG. 6 is a circuit diagram of a semiconductor device in accordance with a second embodiment of the present invention.

Referring to FIG. 6, the semiconductor device of this embodiment includes normal lines A1 and A2 arranged for transfer of signal, a shield line Sb arranged adjacent to the normal lines A1 and A2, a level shifting circuit 210 for receiving an input signal N1 swinging between a power supply voltage VDD level and a ground voltage VSS level, and shifting the input signal to an output signal swinging between a high voltage VPP higher than the power supply voltage VDD level and the ground voltage VSS level to output a shifted signal via the shield line Sb, and a signal input unit 220 for transferring the signal provided via the shield line Sb to an output node N2.

The level shifting circuit 210 is provided with a high level shifter 211 for level-shifting a level of the input signal IN to swing between the high voltage VPP and the ground voltage VSS level, and a driver 210 for driving the shield line Sb by using a signal Sa level-shifted by the high level shifter 211.

The driver 212 is provided with a PMOS transistor MP4 whose one side is connected to the power supply voltage supplying terminal VDD and gate receives an output of the level shifter 211, and an NMOS transistor MN5 whose one side is connected to the other side of the PMOS transistor MP4, gate receives the output of the level shifter 211, and other side is connected to the ground voltage supplying terminal VSS.

The signal input unit 220 is provided with a pull-up MOS transistor MP5 for pulling-up the output node N2 by using the signal transferred via the shield line Sb. The high voltage VPP is characterized by being higher than the ground voltage VSS by a threshold voltage level of the MOS transistor MP5.

A line in which a certain voltage level is set during an initial operation of the semiconductor device and the set voltage level is not varied during a normal operation is mainly used as the shield line Sb. In the case of the semiconductor device, when an active operation and a precharge operation, a write/read operation and a refresh operation are carried out, a line through which a signal is maintained at a constant level without any variation of its phase may be applied as the shield line. For example, in the case of the semiconductor device, the signal delivered through the shield line Sb can be at least one of a signal for controlling a burst length of the semiconductor device, a signal for controlling a CAS latency, a control signal for controlling on/off operations of a delay locked loop, a control signal for controlling ODT, a control signal for deciding a driving capability of the output driver, a control signal for controlling timing of write recovery, a control signal for controlling a test mode and the like.

The level shifter 211 may be located at the front end of the driver 212 or at any other place. For instance, if a signal to be applied to the shield line is generated by decoding diverse signals, the level shifter may be arranged at the front end of a decoder (not shown) for level-shifting the signal before decoding it. In such a case, the decoder decodes an output signal of the level shifter and then conveys a decoded signal to the shield line.

Further, in the semiconductor device, a word line activation voltage maintaining a level higher than the power supply voltage may be used as the high voltage VPP as it is. In this case, it does not need to have a separate generator for generating the high voltage VPP.

Figure 7:
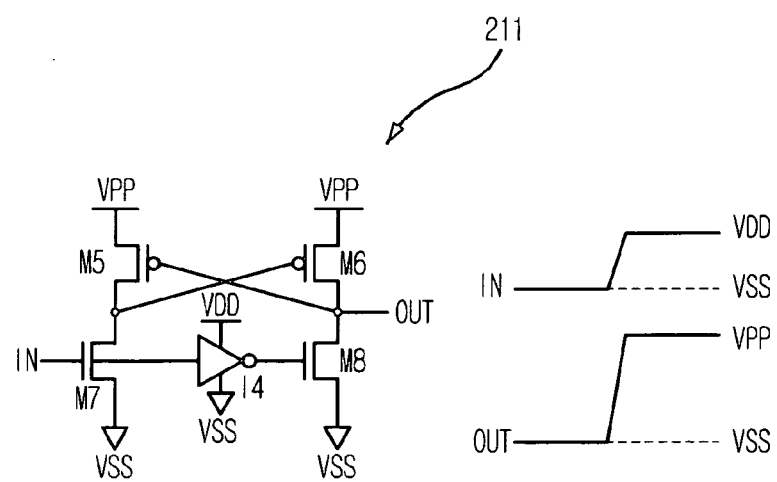
FIG. 7 is a detailed circuit diagram of the high level shifter shown in FIG. 5.

FIG. 7 is a detailed circuit diagram of the high level shifter shown in FIG. 5.

Referring to FIG. 7, the high level shifter 211 includes an NMOS transistor M7 with one side connected to a ground voltage supplying terminal VSS and a gate receiving an input signal IN, an inverter I4 receiving the input signal IN via an input terminal, an NMOS transistor M8 with one side connected to the ground voltage supplying terminal VSS and a gate receiving an output of the inverter I4, a PMOS transistor M5 with one side connected to the other side of the NMOS transistor M7, a gate connected to the other side of the NMOS transistor M8, and other side connected to a high voltage supplying terminal VPP through which the high voltage VPP is supplied, and a PMOS transistor M6 with one side connected to the other side of the NMOS transistor M8, a gate connected to the other side of the NMOS transistor M8, and other side connected to the high voltage supplying terminal VPP.

Figure 8:
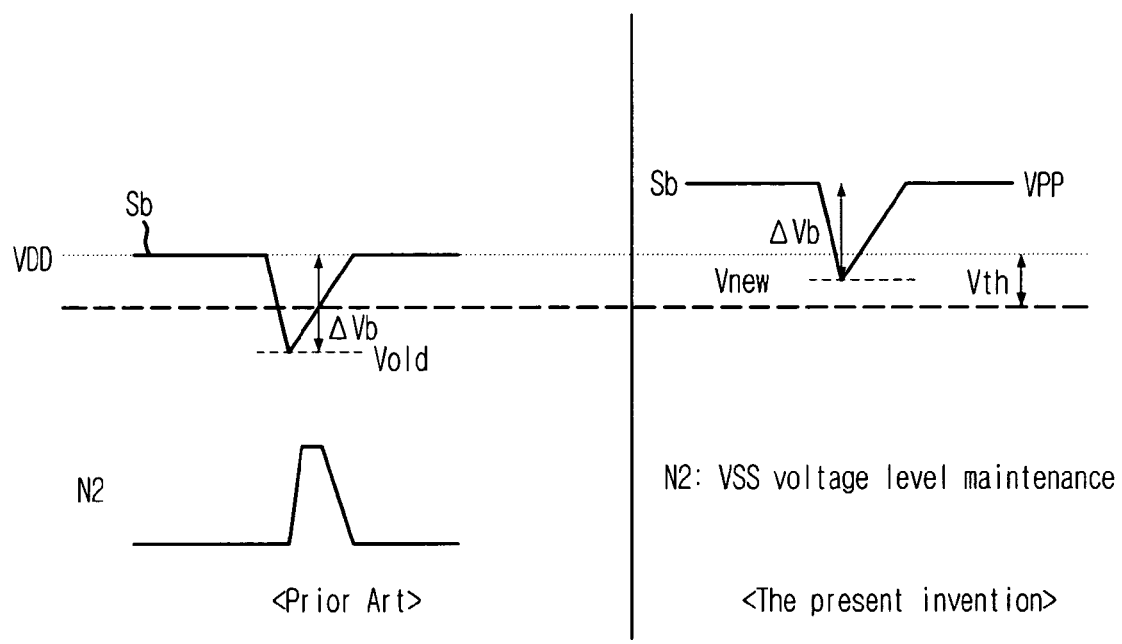
FIG. 8 is a waveform diagram representing the operation of the semiconductor device shown in FIG. 6.

FIG. 8 is a waveform diagram representing the operation of the semiconductor device shown in FIG. 6. Hereinafter, the operation of the semiconductor device of this embodiment will be described in detail with reference to FIGS. 6 to 8.

Referring to the left side of the waveform shown in FIG. 8, if the shield line is maintained to the power supply voltage VDD, a voltage at the node N2 is varied in an undesired direction by a variation of a signal passing through its adjacent lines A1 and A2, which may cause any error.

But, as in the right side of the waveform shown in FIG. 8, the semiconductor device of this embodiment maintains the high voltage VPP level, rather than maintaining the power supply voltage VDD level, if the voltage level on the shield line is maintained at the high level. Here, the high voltage VPP is maintained to be a level higher than the power supply voltage VDD level by a threshold voltage of the MOS transistor MP5 constituting the signal input unit 220.

Although the voltage level applied to the shield line Sb has dropped by ΔVb by a transition of a signal passing through the adjacent lines A1 and A2, the MOS transistor MP5 of the signal input unit 220 is not turned on at an undesired time since it has dropped from the high voltage VPP level by ΔVb. Therefore, although the voltage level on the shield line Sb is varied by the coupling effect, the signal transferred through the node N2 is resultantly maintained in the original state. Namely, the node N2 is allowed to be maintained at the ground voltage VSS level.

Figure 9:
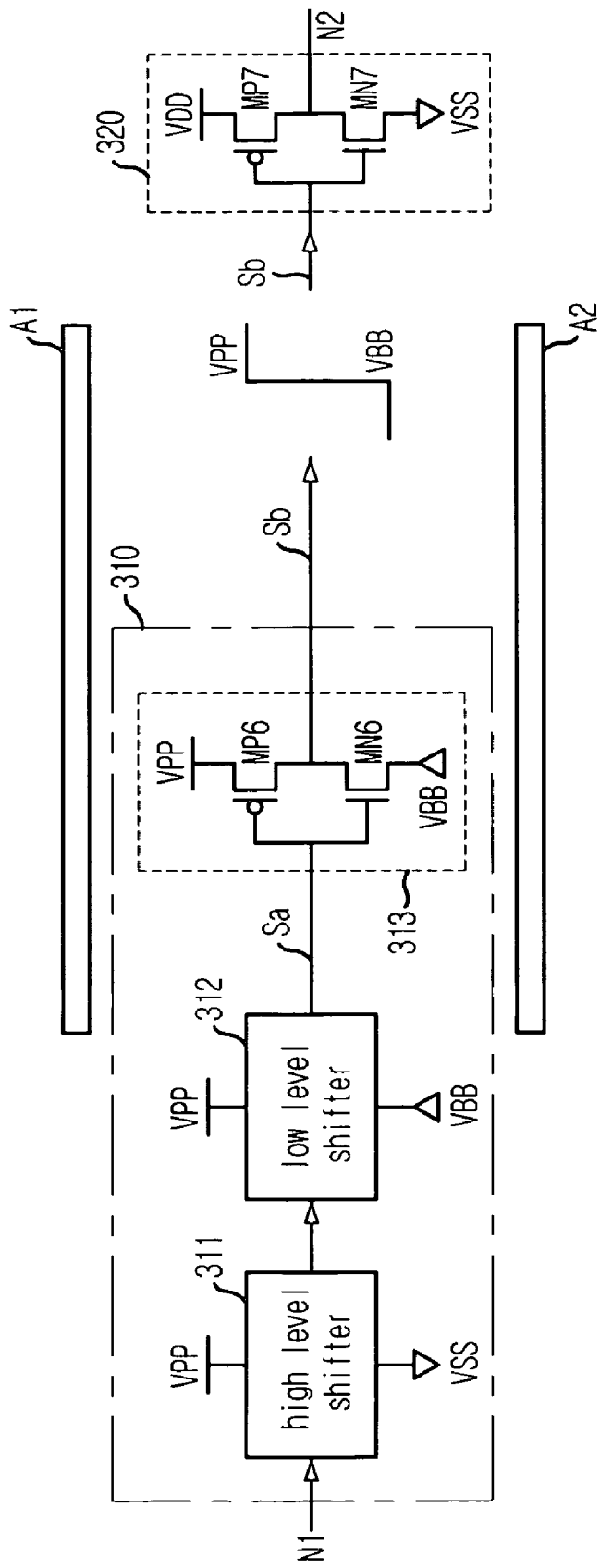
FIG. 9 is a circuit diagram of a semiconductor device in accordance with a third embodiment of the present invention.

FIG. 9 is a circuit diagram of a semiconductor device in accordance with a third embodiment of the present invention.

Referring to FIG. 9, the semiconductor device of this embodiment includes normal lines A1 and A2 arranged for transfer of signal, a shield line Sb arranged adjacent to the normal lines A1 and A2, a level shifting circuit 310 for receiving an input signal N1 swinging between a power supply voltage VDD level and a ground voltage VSS level, and shifting the input signal to an output signal swinging between a high voltage VPP level higher than the power supply voltage VDD level by a predetermined level and a low voltage VBB level lower than the ground voltage VSS level by a predetermined level to output a shifted signal via the shield line Sb, and a signal input unit 320 for transferring the signal provided via the shield line Sb to an output node N2.

The semiconductor device of the third embodiment is implemented by combining the semiconductor devices of the first and the second embodiments. Therefore, since an operation of the semiconductor device of the third embodiment is similar to the operations of the semiconductor devices of the first and the second embodiments, a detailed description thereon will be omitted here for simplicity.

One difference is that driving voltages of a low level shifter 312 are the high voltage VPP and the low voltage VBB since it receives an output signal of a high level shifter 311. The high level shifter 311 and the low level shifter 312 can be configured by using the circuits as shown in FIGS. 7 and 4, respectively. In addition, the signal input unit 320 is provided with both a pull-up MOS transistor MP7 and a pull-down MOS transistor MN7.

As set forth above, the present invention has an advantage in that a final node connected to a shield line can be allowed to be maintained at a desired signal although the shield line is affected by a transition of a signal in the process of transfer of a signal on lines adjacent to the shield line. Accordingly, according to the present invention, the lines which carry a signal maintaining a constant value during a normal operation such as an initial setting operation as in the prior art can be continuously used as the shield line.

Furthermore, in a circuit receiving the signal on the shield line, a gate bias of an NMOS transistor at an input end is lower than a source bias, and a gate bias of a PMOS transistor at an input end is higher than a source bias. Thus, leakage current can be reduced by the MOS transistors coupled with the input end.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    normal lines arranged for transfer of signals;
    a shield line arranged adjacent to the normal lines;
    a level shifting circuit for receiving an input signal swinging between a power supply voltage and a ground voltage, and shifting the input signal to level-shifted signal swinging between the power supply voltage and a low voltage lower than the ground voltage by a predetermined level so that a logic state of an output signal output to an output node is maintained regardless of variations of the signals of the normal lines; and
    a signal input unit in response to the level-shifted signal provided via the shield line to selectively couple the output node to the ground voltage, wherein the signal input unit includes a pull-down circuit for receiving the level-shifted signal and the predetermined level is equal to or greater than a threshold voltage of the pull-down circuit.

2. The semiconductor device as recited in claim 1, wherein the level shifting circuit includes:
    a low level shifter for level-shifting a level of the input signal to swing between the power supply voltage and the low voltage; and
    a driver for driving the shield line by using the signal level-shifted by the low level shifter.

3. The semiconductor device as recited in claim 2, wherein the low level shifter includes:
    a first PMOS transistor having one side connected to the power supply voltage supplying terminal and a gate coupled to the input signal;
    an inverter receiving the input signal via an input terminal;
    a second PMOS transistor having one side connected to a power supply voltage supplying terminal and a gate coupled to an output of the inverter;
    a first NMOS transistor having one side connected to a second side of the first PMOS transistor, a gate connected to a second side of the second PMOS transistor, and a second side connected to a low voltage supplying terminal through which the low voltage is supplied; and
    a second NMOS transistor having one side connected to the second side of the second PMOS transistor, a gate connected to the second side of the first PMOS transistor, and a second side connected to the low voltage supplying terminal.

4. The semiconductor device as recited in claim 3, wherein the driver includes:
    a third PMOS transistor having one side connected to the power supply voltage supplying terminal and a gate coupled to an output of the level shifter; and
    a third NMOS transistor having one side connected to the second side of the third PMOS transistor, a gate coupled to an output of the level shifter, and a second side connected to the low voltage supplying terminal.

5. The semiconductor device as recited in claim 1, wherein the pull-down circuit comprises a MOS transistor having one side connected to the output node, a gate connected to the shield line, and a second side connected to the ground voltage supplying terminal.

6. The semiconductor device as recited in claim 5, wherein the low voltage is lower than the ground voltage by a level above a threshold voltage of the MOS transistor.

7. The semiconductor device as recited in claim 1, wherein the normal lines are disposed in a region adjacent to one side of the shield line and a region adjacent to the other side of the shield line, respectively.

8. The semiconductor device as recited in claim 1, wherein the shield line is a line in which a predetermined voltage level is set during an initial operation of the semiconductor device and the voltage level is not varied during a normal operation.

9. The semiconductor device as recited in claim 1, wherein the input signal transferred through the shield line is at least one of a signal for controlling a burst length of a semiconductor device, a signal for controlling a Column Address Strobe (CAS) latency, a control signal for controlling on/off operations of a delay locked loop, a control signal for controlling On Die Terminal (ODT), a control signal for deciding a driving capability of the output driver, a control signal for controlling a timing of write recovery, and a control signal for controlling a test mode.

10. A method for driving a semiconductor device including normal lines for transfer of signals and a shield line adjacent to the normal lines, comprising the steps of:
receiving an input signal swinging between a power supply voltage and a ground voltage;
shifting the input signal to a level-shifted signal swinging between the power supply voltage and a low voltage lower than the ground voltage by a predetermined level so that a logic state of an output signal output to an output node is maintained regardless of variations of signals of the normal lines; and
in response to the level-shifted signal provided via the shield line, selectively coupling the output node to the ground voltage by using a pull-down circuit to receive the level-shifted signal, wherein the predetermined level is equal to or greater than a threshold voltage of the pull-down circuit.

11. The method as recited in claim 10, wherein the shifting step includes the steps of:
shifting a signal level of the input signal to the low voltage; and
driving the shield line by using the level-shifted signal.

12. The method as recited in claim 11, wherein the low voltage is lower than the ground voltage by a level above a threshold voltage of a MOS transistor.

13. The method as recited in claim 10, wherein the shield line is a line in which a predetermined voltage level is set during an initial operation of the semiconductor device and the voltage level is not varied during a normal operation.

14. The method as recited in claim 10, wherein the input signal transferred through the shield line is at least one of a signal for controlling a burst length of a semiconductor device, a signal for controlling a CAS latency, a control signal for controlling on/off operations of a delay locked loop, a control signal for controlling ODT, a control signal for deciding a driving capability of an output driver, a control signal for controlling a timing of write recovery, and a control signal for controlling a test mode.

* * * * *